United States Patent [19]

Buscher et al.

[11] 4,218,737
[45] Aug. 19, 1980

[54] REVENUE METERING SYSTEM FOR POWER COMPANIES

[75] Inventors: David J. Buscher, Silver Spring, Md.; Robert G. Ellingwood, Vancouver, Wash.; Marc A. Ressler, College Park, Md.

[73] Assignee: The United States of America as represented by the Secretary of the Army, Washington, D.C.

[21] Appl. No.: 829,037

[22] Filed: Aug. 30, 1977

[51] Int. Cl.³ .................. H02J 13/00; G01R 11/57; G01R 19/30
[52] U.S. Cl. .................. 364/493; 364/483; 364/900; 340/151; 324/116
[58] Field of Search ... 364/200 MS File, 900 MS File, 364/483, 492, 493, 464; 340/150, 15; 324/103 R, 116

[56] References Cited
U.S. PATENT DOCUMENTS

| | | | |
|---|---|---|---|
| 3,266,023 | 8/1966 | Werme | 364/200 |
| 3,747,068 | 7/1973 | Bruner | 364/483 |
| 3,855,456 | 12/1974 | Summers | 364/492 |
| 3,886,332 | 5/1978 | Petit | 364/200 |
| 3,972,470 | 8/1976 | Takagi | 364/483 |
| 4,008,458 | 2/1977 | Wensley | 340/151 |
| 4,022,977 | 5/1977 | Numura | 340/151 |
| 4,050,096 | 9/1977 | Bennett | 364/200 |
| 4,075,699 | 2/1978 | Schneider | 324/103 R |
| 4,077,061 | 2/1978 | Johnston | 364/483 |

Primary Examiner—James D. Thomas
Attorney, Agent, or Firm—Nathan Edelberg; Robert P. Gibson; Saul Elbaum

[57] ABSTRACT

An energy meter at an electrical substation contains a detector which changes state each time a quantity of energy is consumed. This data is accumulated in a microprocessor system. Real time energy consumption data is fed back to a customer monitoring station and may be telemetered to a power company central billing station. Customer and power company have their demand periods synchronized by the microprocessor system.

5 Claims, 2 Drawing Figures

4,218,737

REVENUE METERING SYSTEM FOR POWER COMPANIES

RIGHTS OF THE GOVERNMENT

The invention described herein may be manufactured, used, and licensed by or for the United States Government for governmental purposes without the payment to us of any royalty thereon.

FIELD OF THE INVENTION

The present invention relates to data processing systems and more particularly to such a system for metering and communicating energy consumption by a customer and transmitting such information to a power supplier for billing purposes.

BRIEF DESCRIPTION OF THE PRIOR ART

Large industrial electrical users, such as aluminum refineries, require extremely large amounts of power for their operations. For example, in the western states, hydroelectric power is provided to such industrial users. It is not unusual for an electrical substation to be fully utilized by one site of a particular industrial user. Conventionally, such a customer has a usage contract with the power supplier which often defines a demand period as a time period, such as one hour, during which time the customer must not exceed a certain energy consumption level. This is strictly monitored by the customer as well as the power company and in the event energy consumption exceeds the contracted level for any demand period, a penalty is levied against the industrial user. Problems presently exist with conventional electro-magnetic systems which are employed. The mechanical limitations of existing systems limit the accuracy factor. Further, they require a great deal of human intervention and monitoring of analog meters and printers. Even further, prior art systems do not have adequately synchronized demand periods at the user's location and the power company's location. Accordingly, disputes often arise as to whether power consumption during a demand period has exceeded the contractual level. As a further disadvantage, with the present electro-magnetic systems, it is impractical for automatic remote billing to be accomplished without extensive modifications to the existing equipment. There is also a problem with matching scale factors between existing kilowatt hour (KwH) meters and totalizers and demand meters.

BRIEF DESCRIPTION OF THE PRESENT INVENTION

The present invention is directed to a modernization of existing systems of the type described above. A microprocessing system replaces the input totalizers and integrated demand meters previously used. However, existing kilowatt hour and kilovar hour (KVARH) meters are still used since they meet existing needs and are costly to replace. All new installations will use solid state meters. The present invention is compatible with both solid state and electromechanical meters. The scale factor detector detects a certain quantity of energy consumption and generates a KwH change of state in accordance with such scaled energy consumption. The microprocessing system accepts such data and stores and updates this data while making it available to a customer monitoring station. A demand period clock is provided to the microprocessor system as a means for synchronizing the customer and the power supplier with a common demand interval. A data link, which may be phone lines or telemetry, interfaces with the output of the microprocessor system for making power consumption data available to a central billing station of the power company so that the billing function may be automated. A back-up tape storage system is also provided in the event that telemetered data is lost. An on-site terminal including a keypad and display is provided so that an operator may access stored data at the site of the microprocessor sub-system.

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

Figure 1:
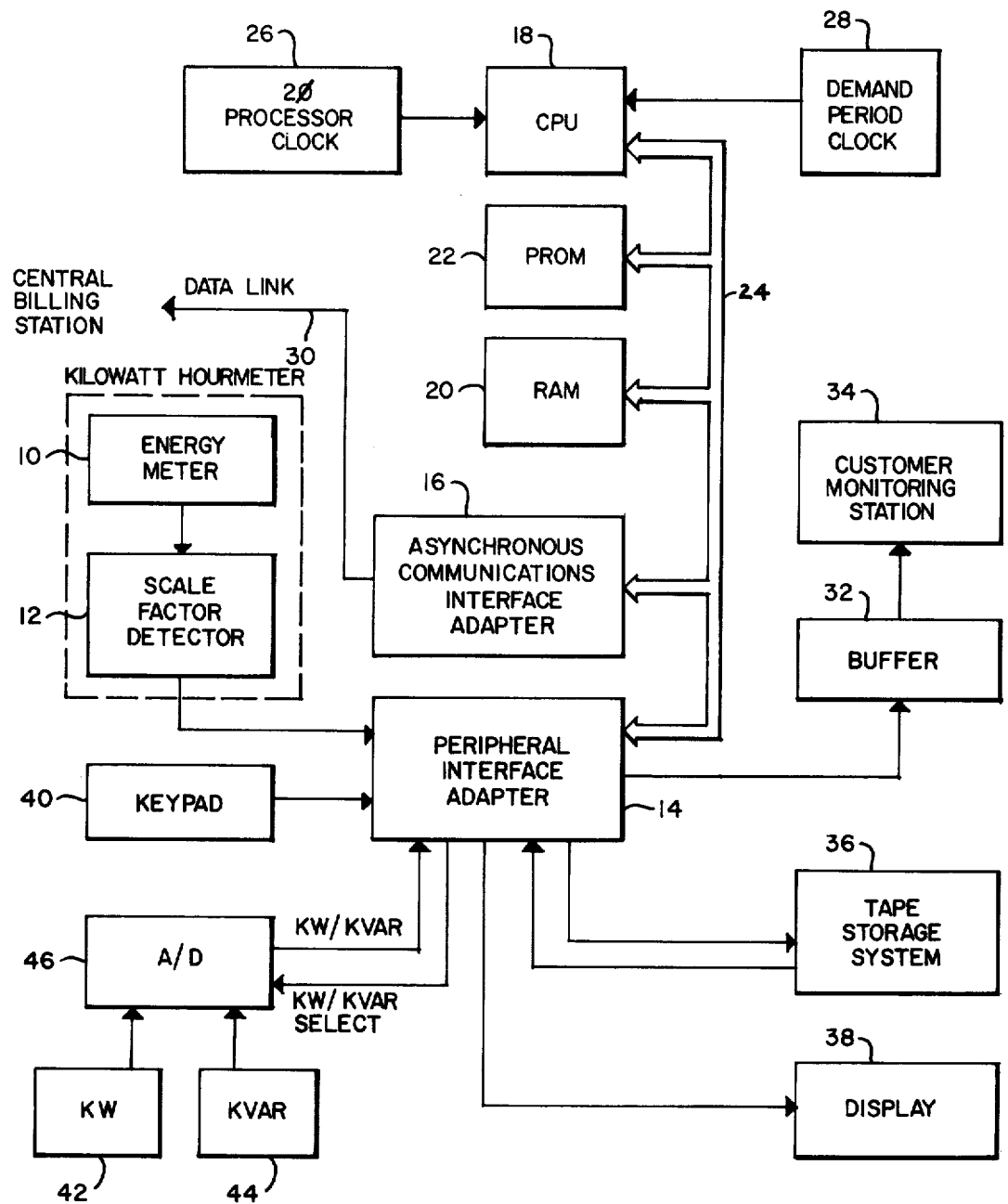
FIG. 1 is a block diagram of the microprocessor system employed in the present invention.

Referring to the figures and more particularly FIG. 1 thereof, a power meter 10 is illustrated as providing analog data, regarding power consumption at an electrical sub-station, to a scale factor detector 12 which changes its state each time a preselected scaled quantity of energy is consumed. These components are conventional and exist in current electrical sub-station installations.

The output from the scale factor detector 12 is fed to a microprocessor system which includes a number of microprocessor chips that are currently available. As an example, the Motorola M6800 microprocessor chips may be employed. These are well documented and appear in the publication entitled "Motorola M6800 Microprocessor Applications Manual" © 1975, published by Motorola, Inc.

The output from the scale factor detector 12 is fed to an input of a peripherals interface adapter 14 such as disclosed on pages 3-9 of the aforementioned Motorola manual. The data is fed through the peripherals interface adapter 14 through a common data-address bus, such as 24, interconnecting a RAM 20, PROM 22 and CPU 18. The RAM 20 includes volatile metering data and scale factors. The RAM 20 also stores accumulated metering data for billing purposes on a periodic basis. It should be stressed that although a single KwH meter 10 is illustrated, the microprocessor system such as described is capable of multi-channel operation which means that several KwH (or KVARH) meters may provide inputs.

An asynchronous communications interface adapter 16 interfaces between microprocessor system and asynchronously operating I/O devices such as microwave links and phone line data communications, etc., all of which is diagrammatically illustrated by the data link 30. Such a data link is customarily coupled with a remotely situated central billing station of a power supplier. The data going out across the data link 30 may include instantaneous power consumption levels and periodic energy consumption quantities, necessary for billing a customer. As will be appreciated, this data acquisition is done automatically, rather than the usual necessity of manually reading recorders or analog meters. A back-up tape storage system 36 of any suitable conventional type is coupled to the peripheral interface adapter 14 to store data as it is fed out from the microprocessor system, such as along the data link 30. Thus, in the event that data is lost across the data link 30, a back-up system is provided. Communication to the microprocessor system from the tape storage system 36 is also possible since the peripheral interface adapter 14 may receive stored data from the tape storage system 36.

Another output from the peripheral interface adapter 14 goes to buffer 32 where certain programmed data is stored for a customer monitoring station 34 which is not, per se, part of the invention. Such a station may include observation instruments of conventional types or computerized process control systems as currently used in large industrial plants. These, of course, do not constitute a necessary component of the present invention.

As previously mentioned, oftentimes a contract is entered into between a customer-user and a power company-supplier, to provide a certain level of power on a regular standardized demand basis, such as hourly. It is therefore important that the demand period be synchronized between the power supplier and the customer so that disputes do not arise as to whether a contractual power consumption limit has been exceeded during a demand period. Such synchronization is provided for by an accurate demand period clock 28 having an output fed to the CPU 18 thereby defining regular data intervals in accordance with a preselected demand period. A regular CPU clock for circuit operation is provided for by a two-phase microprocessor clock 26. Both clocks 26 and 28 are of conventional design.

An output of the peripheral interface adapter 14 is fed to a display 38 of conventional design, such as the Burroughs SSD 1000-0061. The display may be used by a microprocessor system operator for reading data stored in the RAM 20, such as metered data and time, date data. Operator control is effected from a conventional keypad 40, such as manufactured by MICRO-SWITCH Corp. The output of the keypad is directly connected with an input to the peripheral interface adapter 14.

Instantaneously changing power data may be provided to the system through an alternate route. For example, kw meter 42 and kvar meter 44 may measure power consumption on an ongoing basis at the electrical sub-station where the presently described system is installed. Analog information from these meters is fed to a conventional A/D converter 46. Depending on whether the output of meter 42 or 44 is selected along the select line connected between the output of the peripheral interface adapter 14 and the A/D converter 46, respective information from either the kw meter 42 or the kvar meter 44 will be fed to the system. This current or instantaneously changing data, once entered in the microprocessor system, is stored in the RAM 20 and may be provided to the customer monitoring station 34 or provided by the data link 30 to the central billing station.

Figure 2:
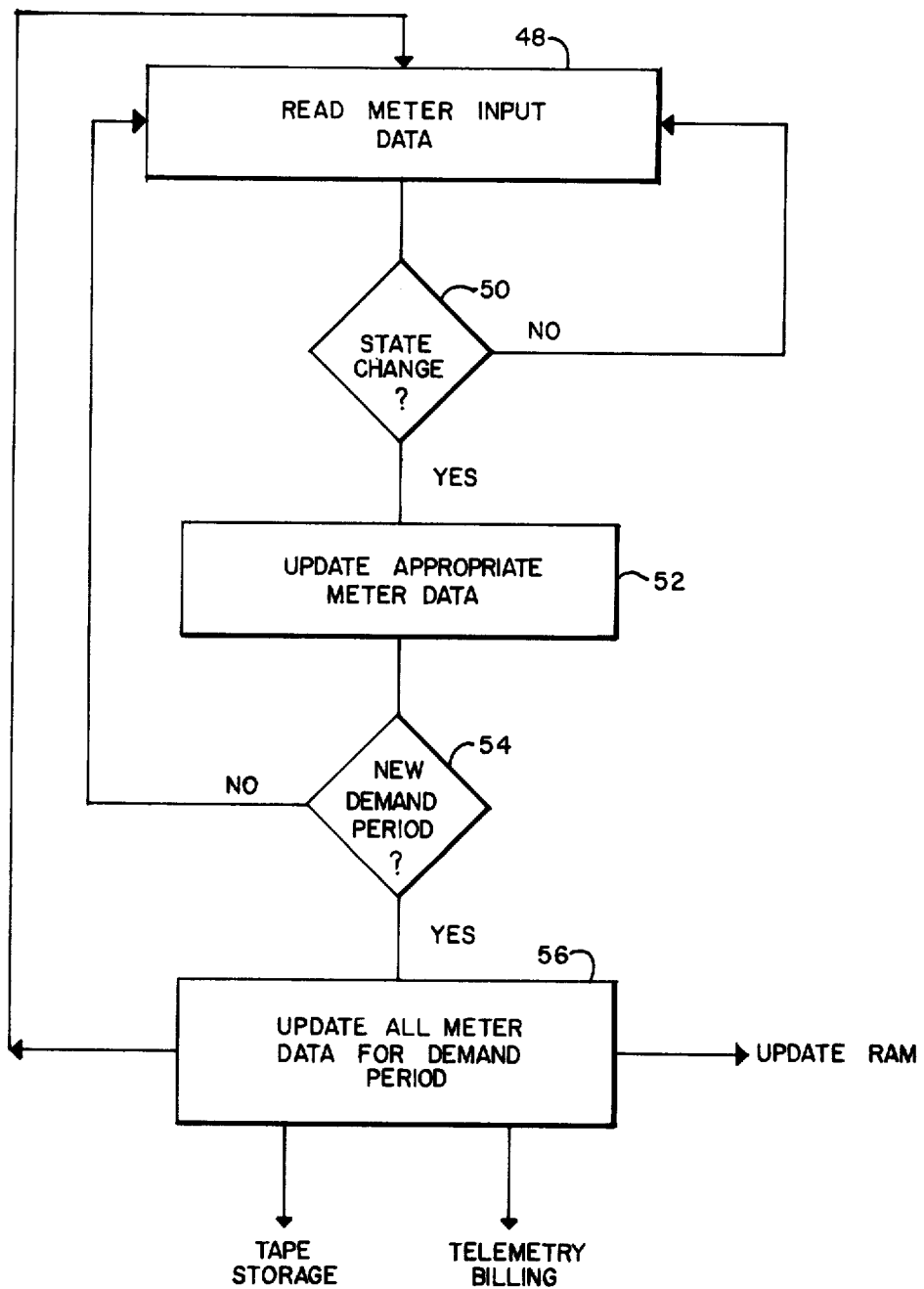
FIG. 2 is a flow chart showing the basic operation of the microprocessor system.

Referring to FIG. 2, a basic flow chart for the system is illustrated.

At step 48, the system illustrated in FIG. 1 reads the meter data. More particularly, this data is derived from the scale factor detector 12 which changes its state upon the occurrence of a preselected energy consumption quantity (step 50). If the detector has not changed its state, the output line from the detector 12 is monitored until such a state change occurs. When it does, there is an appropriate update of the metered data in the RAM 20. This step is indicated by reference numeral 52. Next, a determination is made at step 54 as to whether a new demand period has begun, as dictated by the demand period clock 28. If it has not, data from the scale factor detector 12 continues to be read and correlated with an existing demand period. However, if a new demand period now exists, there is an updating, at step 56, of all historical metered data for the new demand period. As this updating occurs, the contents of RAM 20 are changed and the tape storage system 36 stores the final data for the previous demand period. Also, the final data for each demand period may be fed, via data link 30, to the central billing station.

As will be appreciated, the present system offers a great deal of flexibility by computerizing the monitoring of power consumption of large electrical power users, whereby the customer and the supplier may be instantaneously informed as to power consumption. Further, the system permits the transmission of historical power consumption data to a remotely situated central billing station which may automatically compute a customer's bill in accordance with its contractual obligations.

It should be understood that the invention is not limited to the exact details of construction shown and described herein for obvious modifications will occur to persons skilled in the art.

We claim the following:

1. A microprocessor system for enabling remote billing by a power supplier of customer power consumption comprising:

peripheral interface means for receiving power consumption data as a function of a preselected scale factor and transmitting it along a data bus;

memory means connected to the data bus for storing the power consumption data;

monitoring means connected to the output of the peripheral interface means for providing power consumption data to a customer;

display means connected to the output of the peripheral interface means for selectively displaying stored data to a system operator;

means connected to the input of the peripherals interface means for allowing manual accessing of the data by the operator; and asynchronous communications interface means connected to the data bus for transmitting data in the memory means, to data lines thereby enabling a central station at opposite ends of the data links to compute billing; and a central processing unit connected to the data bus for controlling the operation of the peripheral interface and asynchronous communications interface means as well as the memory means;

first clock means connected to the central processing unit for clocking the unit through its operation, and, second clock means connected to the central processing unit for synchronizing a preselected demand period for both customer and power supplier.

2. The subject matter set forth in claim 1 together with a tape storage system connected to the peripherals interface means for storing data transmitted over the data links thereby serving as a backup for the transmitted data.

3. The subject matter set forth in claim 1 together with analog/digital converting means connected at the input thereof to respective kw and kvar analog data measurement means and at the output thereof to the peripheral interface means for selectively permitting digitization and storage of this volatile data in the memory means.

4. The subject matter set forth in claim 3 together with a programmable read-only memory connected to the data bus for storing an operational program for the system, executed by the central processing unit.

5. The subject matter of claim 4 wherein the manual accessing means is a keypad.

* * * * *